United States Patent [19]
Baumann et al.

[11] Patent Number: 5,523,597
[45] Date of Patent: Jun. 4, 1996

[54] ELECTRONIC DEVICE ACHIEVING A REDUCTION IN ALPHA PARTICLE EMISSIONS FROM BORON-BASED COMPOUNDS ESSENTIALLY FREE OF BORON-10

[75] Inventors: Robert C. Baumann, Dallas, Tex.; Timothy Z. Hossain, Ithaca, N.Y.

[73] Assignee: Texas Instruments Incorporated, Del.

[21] Appl. No.: 342,521

[22] Filed: Nov. 21, 1994

Related U.S. Application Data

[62] Division of Ser. No. 17,543, Feb. 16, 1993, Pat. No. 5,395,783.

[51] Int. Cl.⁶ .................................................. H01L 27/108
[52] U.S. Cl. ........................ 257/297; 257/644; 257/650; 257/651; 257/794; 257/921
[58] Field of Search .................................. 257/297, 644, 257/650, 651, 794, 921

[56] References Cited

U.S. PATENT DOCUMENTS

| 4,833,647 | 5/1989 | Maeda et al. | 365/182 |
| 4,892,840 | 1/1990 | Esquivel et al. | 437/52 |
| 4,894,693 | 1/1990 | Tigelaar et al. | 357/23.6 |
| 5,168,366 | 12/1992 | Sasaki | 257/297 |

FOREIGN PATENT DOCUMENTS

| 58-120533 | 7/1983 | Japan . |
| 60-183768 | 1/1986 | Japan . |
| 62-281358 | 5/1988 | Japan . |
| 02114665 | 7/1990 | Japan . |
| 04334015 | 4/1993 | Japan . |

OTHER PUBLICATIONS

Webb, C., et al., "A 65ns CMOS 1Mb DRAM", ISSCC 1986, pp. 262–263. Feb., 1986.
Shah, A. H., et al., "A 4Mb DRAM with Cross–point Trench Transistor Cell", ISSCC 1986, pp. 268–269. Feb., 1986.
Takada, M., et al., "A 4Mb DRAM with Half Internal–Voltage Bitline Precharge", ISSCC 1986, pp. 270–271. Feb., 1986.

Primary Examiner—Edward Wojciechowicz
Attorney, Agent, or Firm—Lawrence J. Bassuk; Leo N. Heiting; Richard L. Donaldson

[57] ABSTRACT

Reduced soft errors in charge-sensitive circuit elements such as volatile memory cells 200 occur by using boron-11 to the exclusion of boron-10 or essentially free of boron-10 in borosilicate glass 230, 240 deposited on the substrate 206 directly over the arrays of memory cells. Boron-10 exhibits a high likelihood of fission to release a 1.47 MeV alpha particle upon capture of a naturally occurring cosmic ray neutron. This capture occurs frequently in boron-10 because of its high neutron capture cross-section. Boron-11 does not fission.

2 Claims, 2 Drawing Sheets

ELECTRONIC DEVICE ACHIEVING A REDUCTION IN ALPHA PARTICLE EMISSIONS FROM BORON-BASED COMPOUNDS ESSENTIALLY FREE OF BORON-10

This is a divisional of application Ser. No. 08/017,543 filed Feb. 16, 1993 now U.S. Pat. No. 5,395,783.

FIELD OF THE INVENTION

This invention relates generally to semiconductor devices that include circuit elements sensitive to alpha particles, and particularly relates to electronic devices, such as dynamic random access memories, DRAMs, charge-coupled devices, CCDs, and possibly static random access memories, SRAMs, that include charge-sensitive elements whose performance might be compromised by the presence of alpha particles.

DESCRIPTION OF THE RELATED ART

Alpha particle induced errors in DRAMs have been observed and addressed for some time. A paper by Webb, C., et al., "A 65 ns CMOS 1 Mb DRAM", ISSCC 1986, pp. 262–263, discloses a planar one transistor cell design placing the array of memory cells in an N-well to obtain a soft error rate (SER) of less than 1000 FITs without a die coat. A paper by Shah, A. H., et al., "A 4 Mb DRAM with Cross-point Trench Transistor Cell", ISSCC 1986, pp. 268–269 discloses obtaining improved soft error rate over conventional 1-T cells with the stored charge oxide-isolated from the substrate. A paper by Takada, M., et al., "A 4 Mb DRAM with Half Internal-Voltage Bitline Precharge", ISSCC 1986, pp. 270–271 discloses a trench cell having high immunity against alpha-particle soft errors with a buried polysilicon electrode storing the signal charge, while a heavily doped substrate of a P/P++ epitaxial wafer serves as the counter electrode.

SUMMARY OF THE INVENTION

Under the ever present cosmic ray neutron flux, boron-10, a naturally occurring (~19.9% by weight) isotope of boron, fissions, producing lithium-7 and a 1.47 MeV alpha particle ($^{10}B(n,\alpha)^7Li$). Because of the high neutron capture cross section of boron-10, this reaction is a significant source of alpha particles. We have discovered that boron-10 used in boron-doped glass materials proximate the charge-sensitive circuit elements is the major source of alpha particles causing the soft error rate.

Semiconductor devices and particularly those semiconductor devices that include charge-sensitive circuit elements heavily use materials incorporating boron. These materials include boron-doped glass, such as borophosphosilicate glass, often used as an insulating material between metal levels, boron-doped substrate and boron implants. Moreover these boron-incorporating materials typically occur proximate or very close to the charge-sensitive elements, increasing the flux of alpha particles available to effect the soft error rate, SER.

By using enriched boron-11 (depleted boron-10) as a boron source material, especially for the production of borosilicate glasses, the $^{10}B(n,\alpha)^7Li$ decay is avoided, thereby eliminating this significant source of alpha particles. The boron-containing materials thus should essentially be free of boron-10.

The use of boron-11 instead of normal boron does not significantly increase the expense of the process because the cost of the raw materials is about equal. Additionally the enriched boron-11 is chemically identical to the normal boron, so no special equipment or additional processing steps are needed.

DESCRIPTION OF THE PREFERRED EMBODIMENT

Figure 1:
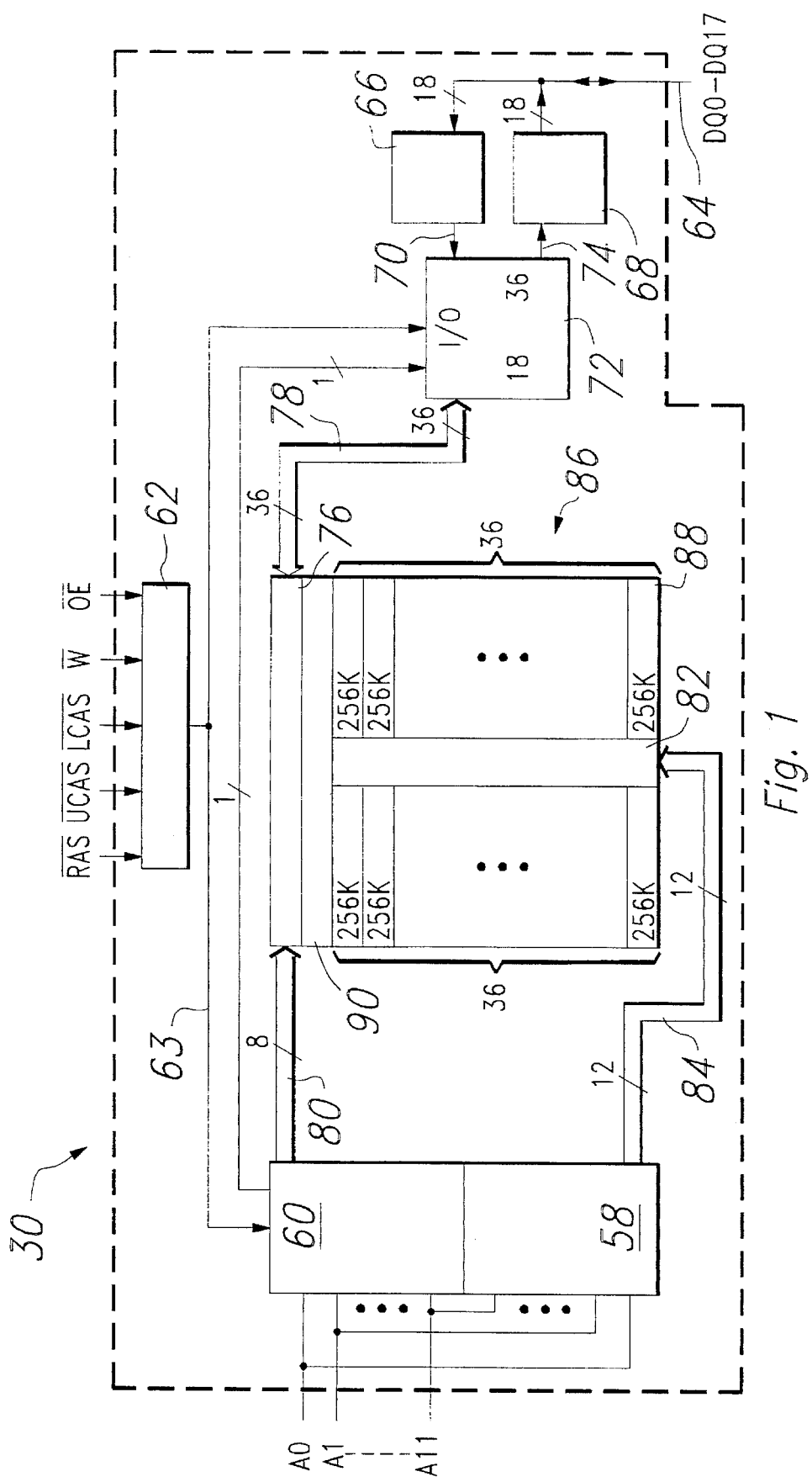
FIG. 1 is a block diagram of a DRAM in which the borosilicate glass materials can be substantially made of boron-11 and essentially free of boron-10.

This text uses an underline character following the name or acronym for a signal to indicate the active low state. This facilitates text preparation using a word processor, even though the drawing may use an overscore to indicate the active low state.

In FIG. 1, DRAM device 30 receives address signals A0–A11 in row address buffers 58 and column address buffers 60. The address signals become latched in the address buffers by use of control signals: RAS_; Upper Column Address Strobe, UCAS_; and Lower Column Address Strobe, LCAS_; received in timing and control block 62. Leads 63 carry desired timing and control signals from block 62 to buffers 58 and 60.

Data signals DQ0–DQ17 are carried in parallel on leads 64 to data in register 66 and data out register 68. Eighteen data signals in parallel pass across leads 70 from data in register 66 to the 18 I/O buffers V2 and 18 data signals in parallel pass across data leads 74 from the 18 I/O buffers 72 to the data out register 68. Thirty-six data signals in parallel pass from the I/O buffers 72 to the column decoders 76 across leads 78. The I/O buffers 72 also receive timing and control signals over leads 63 from timing and control block 62 to make a selection of 18 of the 36 data signals. Column decoders 76 receive 8 address signals in parallel across leads 80 from column address buffers 60. Row decoders 82 receive 12 address signals in parallel over leads 84 from row address buffers 58. Column decoders 76 and row decoders 82 address individual memory cells in overall array 86, which includes 18,874,368 (18M) memory cells, each capable of containing one data bit, configured in 1,048,576 words by 18 bits per word (1M×18). Overall array 86 contains 72 array parts such as array part 88 with each array part containing 256K of memory cells. Thirty-six array parts age located on either side of row decoders 82. The data signals from the selected rows of memory cells in the array parts pass through sense amplifiers 90 to column decoders 76.

Control signals Write, W_, and output enable, OE_, connect to timing and control block 62 to indicate and control the writing and reading of data signals from overall array 86.

Each of the 18M memory cells is a charge-sensitive circuit element capable of holding a quantity of electrical charge representing a data bit. Alpha particles passing through the memory cell induce additional charges that can change the sense of the stored data bit.

Figure 2:
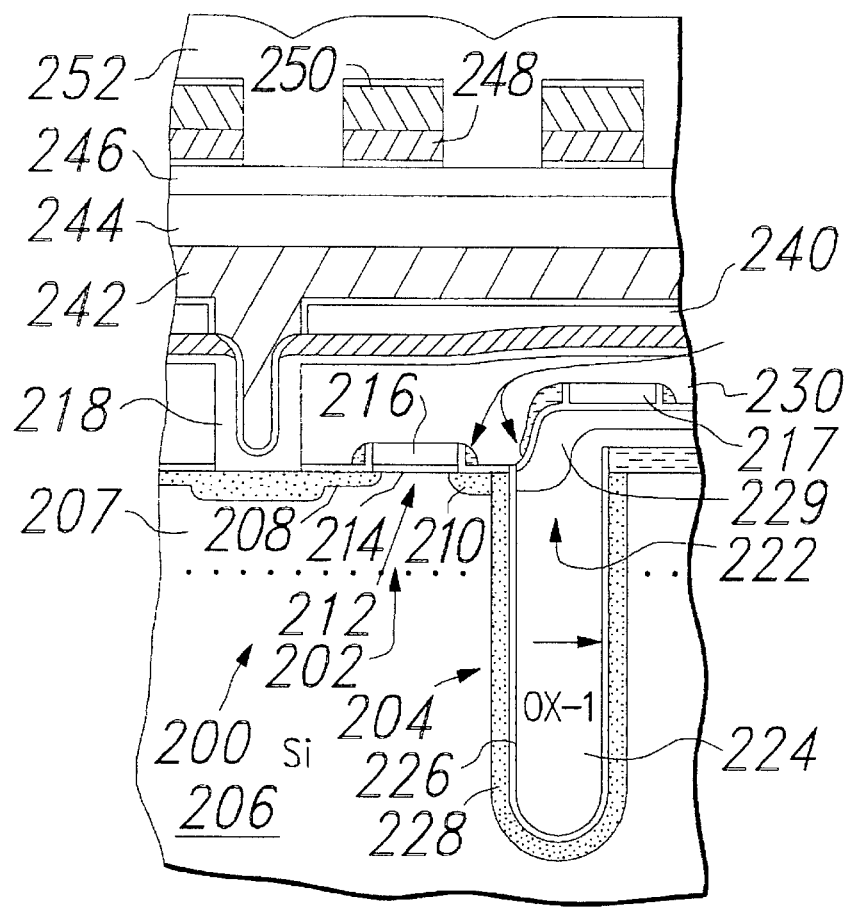
FIG. 2 is a cross-sectional view of a DRAM memory cell depicting the layers of borosilicate glass proximate the memory cell.

In FIG. 2, memory cell 200 includes transfer transistor 202 and bit storing capacitor 204 formed in substrate 206. Memory cell 200 stands as an idealized representation of a dynamic memory cell for purposes of depicting the proximity of the memory cell to the borosilicate glass levels and not necessarily as a preferred embodiment of a memory cell with which the claimed invention is to be practiced. Cell 200 typically represents a trench capacitor memory cell.

Transistor 202 furnishes drain/source regions 208 and 210 formed of phosphorous implant N+ semiconducting material, channel region 212 formed of P-tank material 207, OX-2 gate oxide 214 and poly-2 gate 216. Gate 216 typically forms part of one row or word line extending across the array of memory cells and forming the transistor gate of many cell transistors. Word line 217 forms transistor gates of other memory cells. Bit line 218, formed of silicided poly-3, forms part of a column or bit line extending across the array of memory cells to a sense amplifier and connects to many cells at their respective drain/source regions 208. The word lines and bit lines typically are arranged perpendicular to one another.

Capacitor 204 occurs in and around a trench 222 extending down into substrate 206. A polysilicon-1 field plate 224 substantially fills trench 222. A gate OX-1 capacitive dielectric layer 226 surrounds plate 224 and as implant conductive layer 228 surrounds dielectric layer 226. Dielectric layer 228 connects to source/drain region 210 to connect the capacitor to the transfer transistor 202.

Interlevel oxide ILO insulating layer 229 electrically isolates field plate 224 from word line 217. Above transistor 202 and capacitor 204, bit line oxide BLO insulating layer 230, formed of borophosphosilicate glass having a thickness of about 6000 Å, electrically isolates the gate 216, bit line 218 and word line 217 from one another. Above and extending over silicide poly-3 bit line 218, metal level oxide MLO layer 240 of borosilicate glass has a thickness of about 6000 Å. The device structure includes CVD-W layer 242, MILO-1 layer 244, MILO-2 layer 246, CVD-W parts 248, Al-Si-Cu parts 250 and covering layer 252.

These borosilicate glass layers 230 and 240 exist proximate the capacitor 204 and any alpha particles emitted by them easily pass through to capacitor 204 to cause the described alpha particle-induced soft errors. Other alpha particles produced from structures such as the lead frame or packaging material must travel much further distances to pass through the capacitor 204 if they are to cause the soft errors. Eliminating alpha particle production from the borosilicate glass layers 230 and 240 effects a significant reduction in the alpha particles occurring to cause the soft errors.

These two layers previously included normal boron, which included about 19.9% boron-10 with the remainder being boron-11. This resulted in the alpha particle-induced soft errors previously discussed. The soft error rate becomes significantly reduced by using boron-containing substantially only boron-11 to the exclusion of boron-10 or essentially free of boron-10 with the amount of boron-10 being substantially less than about 19.9% by weight of the boron.

Boron is used extensively in semiconductor processes. Naturally occurring boron is composed of two stable isotopes $^{10}B$ and $^{11}B$. Under the ever-present flux of cosmic rays, composed of neutrons, gamma rays, alpha particles, and other particles, certain reactions can occur which induce the emission of alpha particles. When $^{10}B$ is bombarded by neutrons this reaction can occur:

$^{10}B(n,\alpha)^7Li$: $^{10}B+neutron \rightarrow ^7Li+alpha$ (1.47 MeV).

In being converted to $^7Li$ by a neutron, $^{10}B$ emits a 1.47 MeV alpha particle. This alpha particle is capable of producing soft-errors in charge-sensitive circuit elements such as the memory cells of DRAMs. This might not be an issue except that the thermal neutron capture cross-section of boron-10 is extremely large, thus generating a large number of alpha particles. The alpha flux generated by the $^{10}B(n,\alpha)^7Li$ reaction is at least 1000 times larger than the alpha flux emitted by all the other materials, such as metalizations, oxides, nitrides, polysilicons and silicons, used in DRAM production.

Let us first calculate the primary sources of boron in a typical semiconductor device.

| | |
|---|---|
| boron P-type silicon (1 Ω-cm) | $\sim 10^{15}$ cm$^{-3}$ |
| boron P-type implants (normalized over active volume) | $<10^{12}$ cm$^{-3}$ |
| boron-doped glasses (e.g. BPSG) | $\sim 10^{20}$ cm$^{-3}$ in BPSG |

Therefore, the primary source of alpha particles (α) is from the boron-10 in the BPSG at a concentration of over five orders of magnitude above the other sources.

For example, a 16 Mb DRAM uses ~11000 Å BPSG ~4.2% boron by weight. Thus assuming chip area of ~1 cm$^2$
volume of BPSG ~1 cm$^2 \times 1.1 \times 10^{-4}$ cm=$1.1 \times 10^{-4}$ cm$^3$
density of SiO$_2$ (BPSG) ~2.2 g/cm$^3$
wt. of BPSG=$1.1 \times 10^{-4}$ cm$^3 \times 2.2$ g/cm$^3$=$2.4 \times 10^{-4}$ g
wt. of boron in BPSG=$0.042 \times 2.4 \times 10^{-4}$ g=$1 \times 10^{-5}$ g Number of Boron Atoms =

$$\frac{1 \times 10^{-5} \text{ g}}{10.81 \text{ g/mol}} \times 6.022 \times 10^{23} = 5.6 \times 10^{17}$$

To calculate the alpha flux from the boron-10, we need to know the neutron flux, the boron-10 thermal neutron capture cross-section, and the number of boron-10 atoms:
1. It is well established in the literature that the cosmic ray neutron flux is ~0.02 neutrons/cm$^2$-sec.
2. The thermal neutron capture cross-section for $^{10}B$ is 3838 barns. For most elements the thermal neutron capture cross-section is $1-10^{-3}$ barns.
A barn is a unit of area:
1 barn=$10^{-28}$ m$^2$; and
1 barn=$10^{-24}$ cm$^2$
3. 19.9% of boron is $^{10}B$ so the BPSG used in the 16 Mb DRAM has:
# of $^{10}B$ atoms≡$(5.6 \times 10^{17}$ atoms$) \times (0.199) \equiv 1.11 \times 10^{17}$ atoms
Multiplying 1, 2 and 3, the calculated alpha flux from the BPSG is:
(0.02 neutrons/cm$^2$-sec) (3838 barns) ($10^{-24}$ cm$^2$/barn) ($1.11 \times 10^{17}$ atoms)=BPSG alpha flux
BPSG alpha flux=$8.6 \times 10^{-6}$ α/sec. ~$1 \times 10^{-5}$ α/sec. ~0.031 α/hr.
Compared to the α flux emitted from uranium and thorium impurities in materials:
alpha flux from U and Th ~0.00001 α/hr-cm$^2$
BPSG alpha flux from $^{10}B(n,\alpha)^7Li$ impurities and their daughter products in DRAM materials ~0.031 α/hr-cm$^2$ (based on 1 cm$^2$ die size).

The removal of $^{10}B$ from boron compounds is thus necessary to significantly reduce the package-level alpha flux. BPSG is the primary target, and since separated $^{11}B$ is relatively inexpensive, the formation of BPSG free of $^{10}B$ is inexpensive and reduces alpha flux by more than 1000 times.

To verify the theory, an experiment was performed in which two samples, a wafer with borophosphosilicate glass, BPSG, and a wafer with phosphosilicate glad, PSG, were exposed to a neutron flux. The BPSG wafer was fabricated in the normal fashion (e.g. the boron contained both $^{10}$B and $^{11}$B) and the PSG wafer obviously had no boron. Both films were 5800 Å thick. The geometry of the experiment is depicted in FIG. 3.

Figure 3:
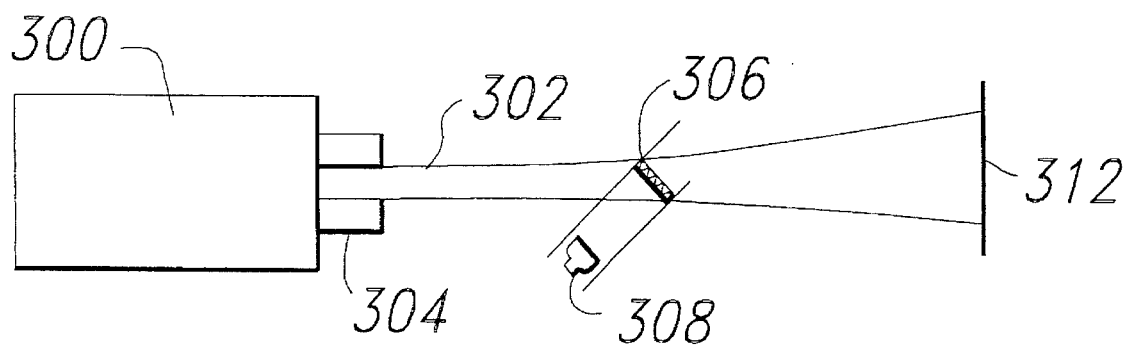
FIG. 3 is a diagram depicting a test fixture used to verify the discovery.

In FIG. 3, a source 300 of neutrons, such as a nuclear reactor, emits a beam 302 of neutrons from a beam port 304. Beam 302 impinges on sample 306. Alpha particles produced from the neutrons striking the sample and reacting with the included materials travel from the sample to the detector 308. Beam stop 312 terminates beam 302.

Neutron flux: $1 \times 10^9$ neutrons/cm$^2$-sec.
Solid angle subtended by detector: 0.1%
α particles emitted from BPSG sample: 550,000/hr. (as observed by the detector)

Total α Particles Emitted From Sample =

$$\frac{5.5 \times 10^5 \text{ α/hr}}{0.001} = 5.5 \times 10^8 \text{ α/hr}$$

Alpha flux=$5.5 \times 10^8$ α/hr-cm$^2$ @a neutron flux of $3.6 \times 10^{12}$ neutrons/cm$^2$-hr.
No alpha flux was observed from the PSG wafer.
Therefore under the natural cosmic ray neutron flux of 0.02/sec. ~72/hr. cm$^2$ Acceleration Factor =

$$\frac{\text{Reactor Neutron Flux}}{\text{Natural Cosmic Ray Flux}} = \frac{3.6 \times 10^{12}/\text{cm}^2\text{-hr}}{72/\text{cm}^2\text{-hr}} = 5 \times 10^{10}$$

Natural α Flux From *BPSG* =

$$\frac{\text{Observed α Flux in Reactor}}{\text{Acceleration Factor}} = \frac{5.5 \times 10^8 \text{ α/hr-cm}^2}{5 \times 10^{10}}$$

Natural α flux from *BPSG* =

0.011 60/hr-cm$^2$ (sample thickness 5800Å)

This result is in close agreement with the theoretical calculation that indicated 0.031 α/hr-cm$^2$ for a BPSG film 11,000 Å thick.

From the theoretical and experimental calculations it is clear that replacing regular boron with the $^{11}$B isotope (e.g. removing $^{10}$B) will have a very profound impact on reducing alpha flux in semiconductor devices (or any other devices using "natural" boron compounds). This work shows that by using $^{11}$B in all processes that usually incorporate boron, the alpha flux due to the $^{10}$B(n,α)$^7$Li reaction induced by cosmic neutron flux can be eliminated. This is especially crucial for charge-sensitive circuit elements such as the memory cells of DRAMS. Using separated or enriched $^{11}$B in place of normal boron can reduce package-level alpha flux by at least 1000 times.

The disclosed embodiment can be modified and varied while remaining within the scope of the following claims. While the claimed invention has been explained in connection with the embodiment of a DRAM, the claimed invention also finds utility in other electronic devices having charge-sensitive circuit elements such as charge-coupled devices, CCDs, and static random access memories, SRAMs. Further, while a trench capacitor memory cell has been disclosed, other memory cells such as stacked capacitor structures can use the claimed invention.

While the described embodiment arranges the borosilicate or boron-doped glass materials in layers over the semiconductor substrate, other arrangements are possible; these include forming the boron in the substrate itself.

Further, the claimed invention extends beyond the described embodiment of an electronic device to any application incorporating boron in an alpha particle sensitive environment. For example some optical lens structure could have an alpha particle sensitive part coated with a boron-doped material. In that situation, essentially eliminating the boron-10 significantly extends the life of the alpha particle sensitive part.

We claim:

1. A DRAM device comprising:

a substrate of semiconducting material;

plural dynamic memory cells formed on the substrate, each cell having a single transfer transistor connected to a charge storing capacitor and each cell being a charge-sensitive semiconductor circuit element; and at least one borosilicate glass layer, containing boron, formed over the substrate and overlying and being proximate the memory cells, the borosilicate glass layer electrically insulating the memory cells, and the boron being substantially boron-11 and essentially free of boron-10.

2. The DRAM device of claim 1 including a second borosilicate glass layer, containing boron, formed over the substrate and overlying and being proximate the charge-sensitive semiconductor circuit elements, the boron being substantially boron-11 and essentially free of boron-10.

* * * * *